(12) United States Patent
Ansari

(10) Patent No.: US 11,220,867 B2
(45) Date of Patent: Jan. 11, 2022

(54) CONTINUOUS LIVE TRACKING SYSTEM FOR PLACEMENT OF CUTTING ELEMENTS

(71) Applicant: Halliburton Energy Services, Inc., Houston, TX (US)

(72) Inventor: Usman Sami Ansari, Tomball, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1406 days.

(21) Appl. No.: 15/035,725

(22) PCT Filed: Dec. 10, 2013

(86) PCT No.: PCT/US2013/074142
§ 371 (c)(1),
(2) Date: May 10, 2016

(87) PCT Pub. No.: WO2015/088500
PCT Pub. Date: Jun. 18, 2015

(65) Prior Publication Data
US 2016/0326808 A1 Nov. 10, 2016

(51) Int. Cl.
*G06G 7/48* (2006.01)
*E21B 10/08* (2006.01)
(Continued)

(52) U.S. Cl.
CPC ............. *E21B 10/08* (2013.01); *B23P 19/10* (2013.01); *E21B 10/00* (2013.01); *E21B 10/42* (2013.01); *E21B 10/43* (2013.01); *G06F 30/00* (2020.01)

(58) Field of Classification Search
CPC .................................................... G06Q 10/20
See application file for complete search history.

(56) References Cited

U.S. PATENT DOCUMENTS 4,815,342 A * 3/1989 Brett ................. B23P 15/28
700/159
6,059,494 A * 5/2000 Susnjara ............. B23Q 11/006
408/11
(Continued)

FOREIGN PATENT DOCUMENTS

CN 102959176 3/2013

OTHER PUBLICATIONS

Tarbox et al. IVIS: An Integrated Volumetric Inspection System IEEE (Year: 1994).*
(Continued)

*Primary Examiner* — Rehana Perveen
*Assistant Examiner* — Cuong V Luu
(74) *Attorney, Agent, or Firm* — Thomas Rooney; Baker Botts L.L.P.

(57) ABSTRACT

A method of manufacturing a drill bit or other oil-field tool includes aligning a cutting element support structure or a support structure for an alternative tool element to an image of a computer-generated model of a drill bit assembly or a computer-generated model of an alternative tool assembly. The method further includes placing a tool element on the support structure and comparing the placement of the tool element on the support structure to the placement of a model of the tool element on the image of the model of the tool assembly using real-time continuous deviation feedback. The method also includes adjusting the placement of the tool element on the element support structure to match the placement of the model of the tool element on the image of the model of the tool assembly and joining the tool element to the support structure.

20 Claims, 7 Drawing Sheets

(51) Int. Cl.
*E21B 10/43* (2006.01)
*E21B 10/00* (2006.01)
*G06F 30/00* (2020.01)
*B23P 19/10* (2006.01)
*E21B 10/42* (2006.01)

(56) References Cited

U.S. PATENT DOCUMENTS

| | | | | |
|---|---|---|---|---|
| 7,233,837 | B2 * | 6/2007 | Swain | B23Q 9/00 700/176 |
| 7,398,840 | B2 | 7/2008 | Ladi et al. | |
| 7,621,349 | B2 | 11/2009 | Da Silva et al. | |
| 8,036,776 | B2 * | 10/2011 | Hellberg | B25J 9/1674 700/245 |
| 8,355,815 | B2 | 1/2013 | Luce et al. | |
| 8,936,109 | B2 | 1/2015 | Stowe, II et al. | |
| 2002/0095239 | A1 * | 7/2002 | Wallach | G05D 1/0274 700/245 |
| 2003/0090682 | A1 * | 5/2003 | Gooch | G01B 11/002 356/620 |
| 2003/0208302 | A1 * | 11/2003 | Lemelson | G05B 19/19 700/245 |
| 2005/0216032 | A1 * | 9/2005 | Hayden | A61B 17/17 606/130 |
| 2006/0122495 | A1 * | 6/2006 | Kienzle, III | A61B 6/02 600/424 |
| 2006/0180356 | A1 | 8/2006 | Durairajan et al. | |
| 2007/0247615 | A1 * | 10/2007 | Bridges | G01B 11/002 356/139.03 |
| 2009/0158898 | A1 | 6/2009 | Sherwood et al. | |
| 2009/0284529 | A1 * | 11/2009 | Aguiar | G06T 13/40 345/420 |
| 2010/0114350 | A1 * | 5/2010 | Kanai | G05B 19/4097 700/98 |
| 2010/0204824 | A1 * | 8/2010 | Luce | B25J 9/1687 700/219 |
| 2010/0282026 | A1 | 11/2010 | Luce et al. | |
| 2010/0312370 | A1 * | 12/2010 | Lind | E21B 41/00 700/98 |
| 2011/0060341 | A1 * | 3/2011 | Angibaud | A61B 17/155 606/89 |
| 2011/0104642 | A1 * | 5/2011 | Luksch | A61C 13/081 433/201.1 |
| 2011/0288812 | A1 * | 11/2011 | Thierman | G01B 11/002 702/141 |
| 2013/0013251 | A1 * | 1/2013 | Schoonmaker | B66C 13/46 702/152 |
| 2013/0197686 | A1 | 8/2013 | Luce et al. | |
| 2013/0218528 | A1 * | 8/2013 | Lind | E21B 41/00 703/1 |
| 2013/0248256 | A1 | 9/2013 | Spencer et al. | |
| 2013/0345718 | A1 * | 12/2013 | Crawford | A61B 17/025 606/130 |
| 2014/0176935 | A1 * | 6/2014 | Maslennikov | G01B 11/14 356/51 |
| 2015/0223941 | A1 * | 8/2015 | Lang | A61B 17/15 623/19.11 |
| 2018/0049622 | A1 * | 2/2018 | Ryan | A61B 34/10 |
| 2018/0168740 | A1 * | 6/2018 | Ryan | A61B 1/317 |
| 2018/0178324 | A1 * | 6/2018 | Bird | B23K 26/20 |

OTHER PUBLICATIONS

Peter Corke Visual Control of Robots: High-Performance Visual Servoing, 1996 (Year: 1996).*
Wilson et al. Relative End-Effector Control Using Cartesian Position Based Visual Servoing IEEE Transactions on Robotics and Automation, vol. 12, No. 5, Oct. 1996 (Year: 1996).*
GOM Inspect Professional, V7.5 Manual—Inspection Advanced/Unit A-E, GOM Optical Measuring Techniques (2011); 122 pages.
Office Action for Chinese Patent Application No. 201380080757.X, dated Mar. 8, 2017, no English translation; 8 pages.
International Search Report and Written Opinion, Application No. PCT/US2013/074142; 17 pgs, dated Sep. 30, 2014.

* cited by examiner

US 11,220,867 B2

CONTINUOUS LIVE TRACKING SYSTEM FOR PLACEMENT OF CUTTING ELEMENTS

RELATED APPLICATION

This application is a U.S. National Stage Application of International Application No. PCT/US2013/074142 filed Dec. 10, 2013, which designates the United States, and which is incorporated herein by reference in its entirety.

FIELD OF THE INVENTION

The present disclosure relates generally to systems and methods for fabricating drill bits or other tools for drilling a hydrocarbon recovery well, and more particularly to systems and methods for manufacturing such drill bits or other oil-field tools by using real-time visual feedback that allows a user to view a rendering of the drill bit relative to a model drill bit to enhance the precision of the manufacturing process.

DESCRIPTION OF RELATED ART

Wells are drilled to various depths to access and produce oil, gas, minerals, and other naturally-occurring deposits from subterranean geological formations. The drilling of a well is typically accomplished with a drill bit that is rotated to advance the wellbore by removing topsoil, sand, clay, limestone, calcites, dolomites, or other materials. The drill bit is typically a rotary cone drill bit or a fixed cutter drill bit. Generally, a rotary cone drill bit includes a drill bit body made up of multiple rotating parts that include cutting elements, and a fixed cutter drill bit includes a one-piece body having cutting elements affixed to the exterior of the drill bit body. The drill bit body may be formed from any number of fabrication methods, such as casting, machining, or a combination thereof. In the case of a fixed cutter drill bit, the cutting elements, which are the relatively sharp elements of a drill bit that engage and remove material from the formation to form the wellbore, are typically installed to complete the drill bit after the drill bit body has been formed. In the case of a rotary cone drill bit, the cutting elements are typically affixed to rotary cones that are installed in a drill bit assembly prior to completion of the drill bit.

DETAILED DESCRIPTION OF ILLUSTRATIVE EMBODIMENTS

Figure 1:
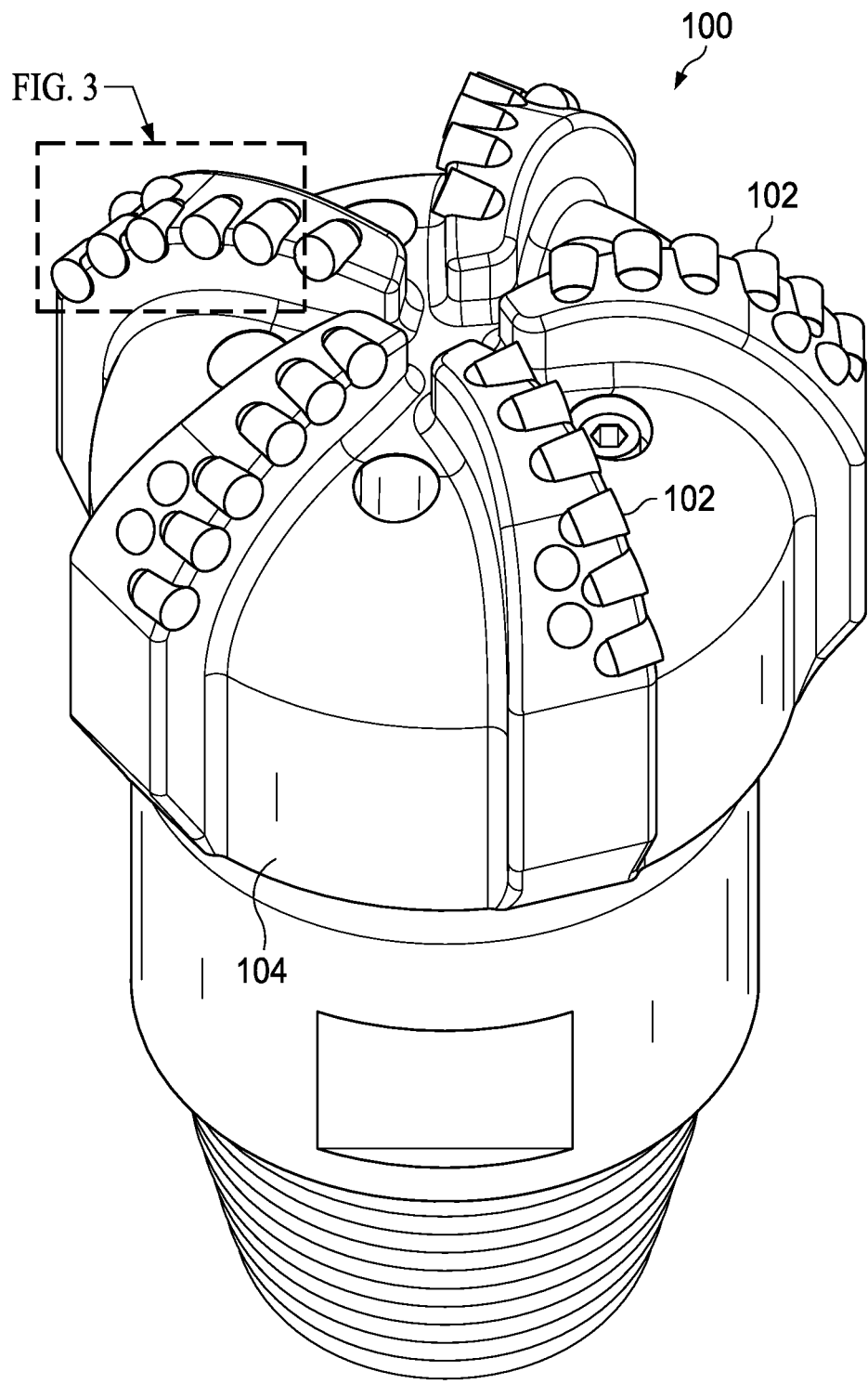
FIG. 1 is a perspective view of a fixed cutter drill bit having multiple cutting elements affixed to a drill bit body.

In the following detailed description of the illustrative embodiments, reference is made to the accompanying drawings that form a part hereof. These embodiments are described in sufficient detail to enable those skilled in the art to practice the invention. It is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

The placement of the cutting elements relative to a drill bit body is an important factor in maintaining the effectiveness of a drill bit. As referenced herein, placement of a cutting element may refer to both the angular and positional orientation of the cutting element relative to a drill bit body to which the cutting element is affixed. For example, when installing a cutting element in a drill bit fabrication process, placement of the drill bit body may entail placing the cutting element at a particular location on the surface of the drill bit body and orienting the cutting element so that, when the drill bit is operated, a cutting surface of the cutting element will engage a formation at an angle and depth that are consistent with design specifications. Placement of the cutting element may therefore entail placing the cutting element using coordinate measurements from a reference point on the drill bit body and adjusting the angle and height of the cutting element's cutting surface so that a face of the cutting element is affixed at a specified angle and height relative to an outer surface of the drill bit body. Placement of a cutting element may be an important factor in ensuring that the drill bit engages a formation as intended by a designer to efficiently remove material and form a well.

Among other things, this disclosure describes methods and systems for using scanning, measurement, projection, continuous tracking, and live-video display technologies of a three-dimensional imaging system to track and improve the placement of a tooling structure as it is fixed to a tool during a fabrication process. For example, the illustrative systems and method may be applicable to joining a cutting element to a drill bit body during a process for fabricating a drill bit. A representative method may include aligning a drill bit body to an image of a computer-generated, three-dimensional model of a drill bit or, in case or a rotary cone drill bit, a rotary cone that supports the drill bit. The model of the drill bit may include a model of a cutting element and a model of a drill bit body to improve the accuracy of the placement of the cutting element on the drill bit body. The method may also include comparing the placement of the cutting element on the drill bit body to the placement of a visual representation of the cutting element relative to an image of the computer-generated, three-dimensional model of the drill bit in real-time. As referenced herein, a computer-generated, three-dimensional model of a part may be referred to as a "model" part. In the case of a model drill bit or model cutting element support structure, which may be a model drill bit body or a model rotary cone, the model may the cutting elements or positional information indicating the intended position of the cutting elements.

The aforementioned comparison may include viewing a continuous, live video feed of an image of the model drill bit body and an image of the actual drill bit body and images of the model and actual cutting element. The method may also include adjusting the relative position of the cutting element on the drill bit body until the position of the cutting element matches the relative position of the model cutting element on the image of the model drill bit body, and joining the cutting element to the drill bit body.

The representative method may be implemented by placing measurement point markers on a drill bit body, scanning the drill bit body, identifying the locations of the markers as measurement points, and correlating the measurement points to reference points on the model drill bit that are indicative of locations of the markers relative to the drill bit body when the drill bit is completed within design tolerances. The live video feed may show the actual marker locations as they are aligned to the reference point locations during placement of the cutting element in additional to quantitative data that reflects how accurately the cutting element is placed on the drill bit body. For example, the live video feed may also show instantaneous calculations, based on the comparison of measurement points to reference points. Such instantaneous calculations may indicate the extent to which a location of an axis of a circular feature of a drill bit deviates from the location of a corresponding axis on the model drill bit. Similar calculations may reflect a live continuous display of (i) angles of deviation between part surfaces and model part surface, (ii) the volume differential between a scanned part and a model part, which may indicate the extent to which the theoretical volumes overlap, and (iii) the area differential between a scanned part and a model part, which may indicate the extent to which the surface area of the scanned part and model part overlap.

Figure 2:
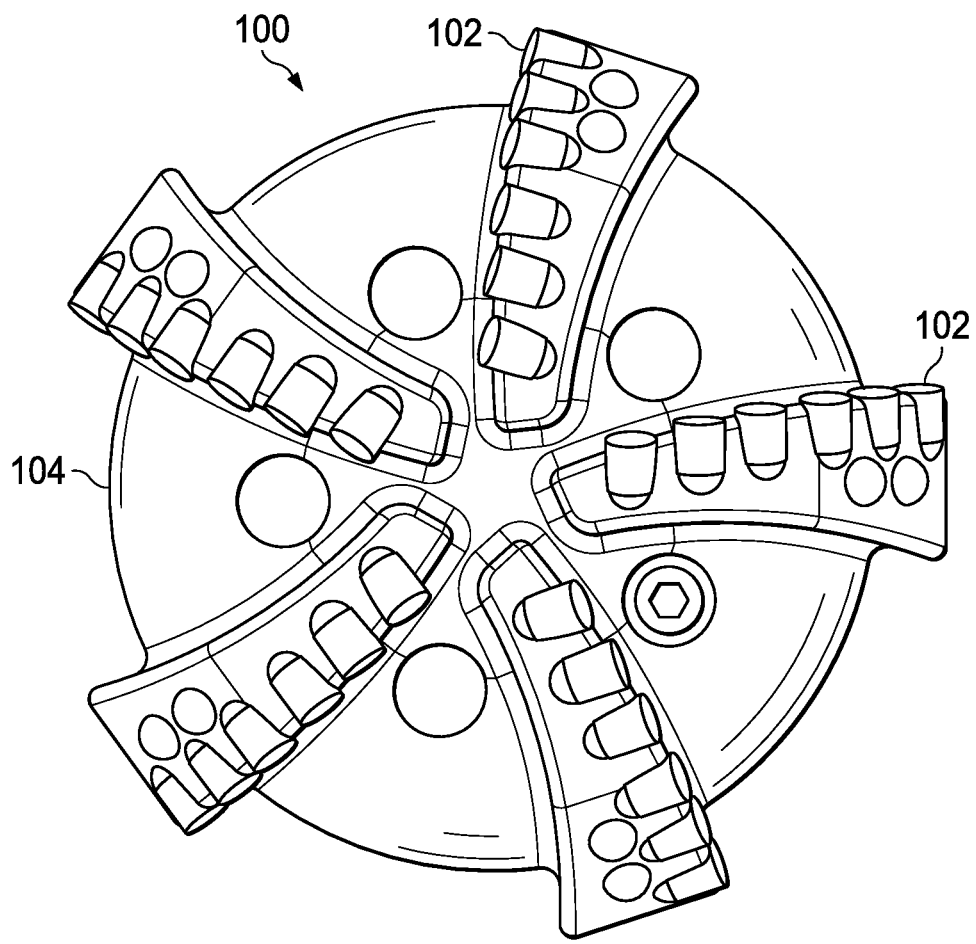
FIG. 2 is a top view of the drill bit of FIG. 1.
Figure 3:
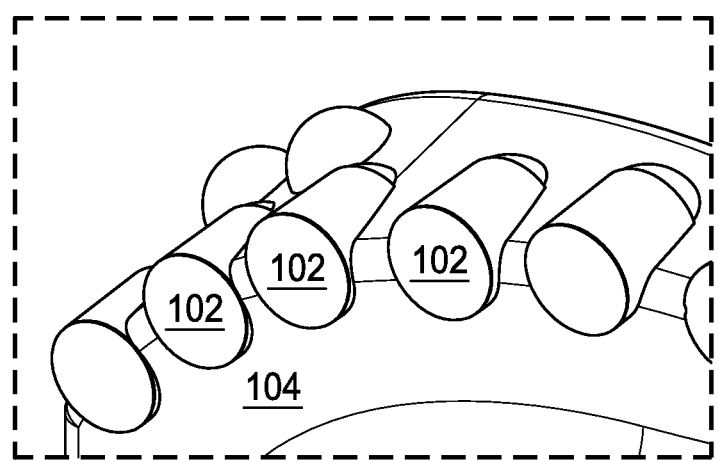
FIG. 3 is a close-up perspective view of the drill bit of FIG. 1, showing a plurality of cutting elements affixed to the drill bit body.

Referring now to FIGS. 1-3 a representative drill bit 100 is formed from a drill bit body 104 and a plurality of cutting elements 102. Through casting, machining, and joining processes, and combinations thereof, the drill bit may also include additional cutting structures, junk slots, fluid flow path, and nozzle openings. The cutting elements 102 may be arranged about the drill bit body 104 in a way that optimizes performance of the drill bit 100 with regard to certain factors, such as the amount of material removed by the bit, the level of precision with which the drill bit forms a wellbore, and the durability of the drill bit 100. The cutting elements may vary in size, shape, and orientations, and are typically bonded to the drill bit body 104 using a brazing process wherein a molten bonding material is applied between the cutting element 102 and drill bit body 104, and allowed to cool and solidify to affix the cutting element 102 to the drill bit body 104. In place of brazing, other joining processes may also be used to join the cutting element 102 to the drill bit body 104. Such other joining processes may include welding, applying an adhesive, and other similar processes.

While the cutting elements 102 may frequently be affixed to the drill bit 100 by inserting the cutting elements 102 into prefabricated pockets or other locating features, in other instances it may be necessary to affix cutting elements 102 to a drill bit body 104 that does not include such locating features, or to install the cutting elements 102 in a way that benefits form additional precision. In either case, the cutting element 102 may be brazed using a torch that heats and melts a metal or metal alloy brazing material between the mating surfaces of the cutting element 102 and drill bit body 104 and the cutting element 102 may be rotated or otherwise manipulated to ensure that the brazing material occupies the entire interface between the cutting element 102 and drill bit body 104. This fabrication process may be a manual fabrication process in which one person applies brazing material and operates the torch and the other manipulates the cutting element 102, an automated process to which a machine accomplished the prior functions, or a combination thereof.

Figure 4:
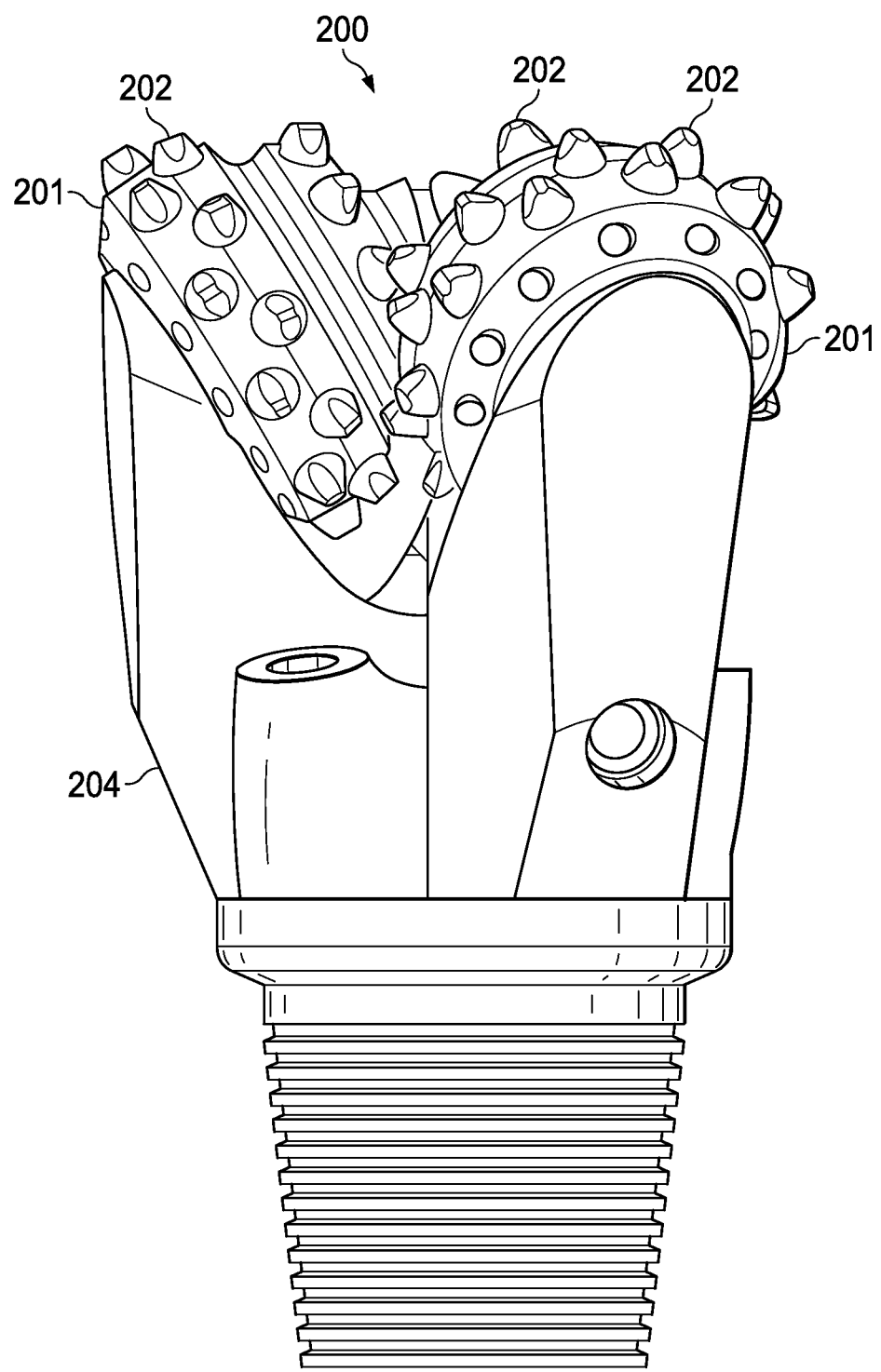
FIG. 4 is a side, perspective view of a rotary cone drill bit having a plurality of rotary cones and a plurality of cutting elements affixed thereto.

FIG. 4 shows an illustrative embodiment of a rotary cone drill bit 200 having a drill bit body 204 that supports a plurality of rotary cone elements 201 that includes cutting elements 202. The rotary cone drill bit 200 is analogous to the fixed cutter drill bit 100 described above with respect to the placement of the cutting elements 202 on the rotary cone drill bit 200. With the rotary cone drill bit 200, however, the cutting elements 202 are affixed to the rotary cones 201 rather directly to the drill bit body 204. Again, the cutting elements 202 may be arranged in a way that optimizes performance of the drill bit 200 in consideration of other design factors such as the rate at which material is removed, the level of precision with which the drill bit forms a wellbore, and the durability of the drill bit 200.

Figure 6:
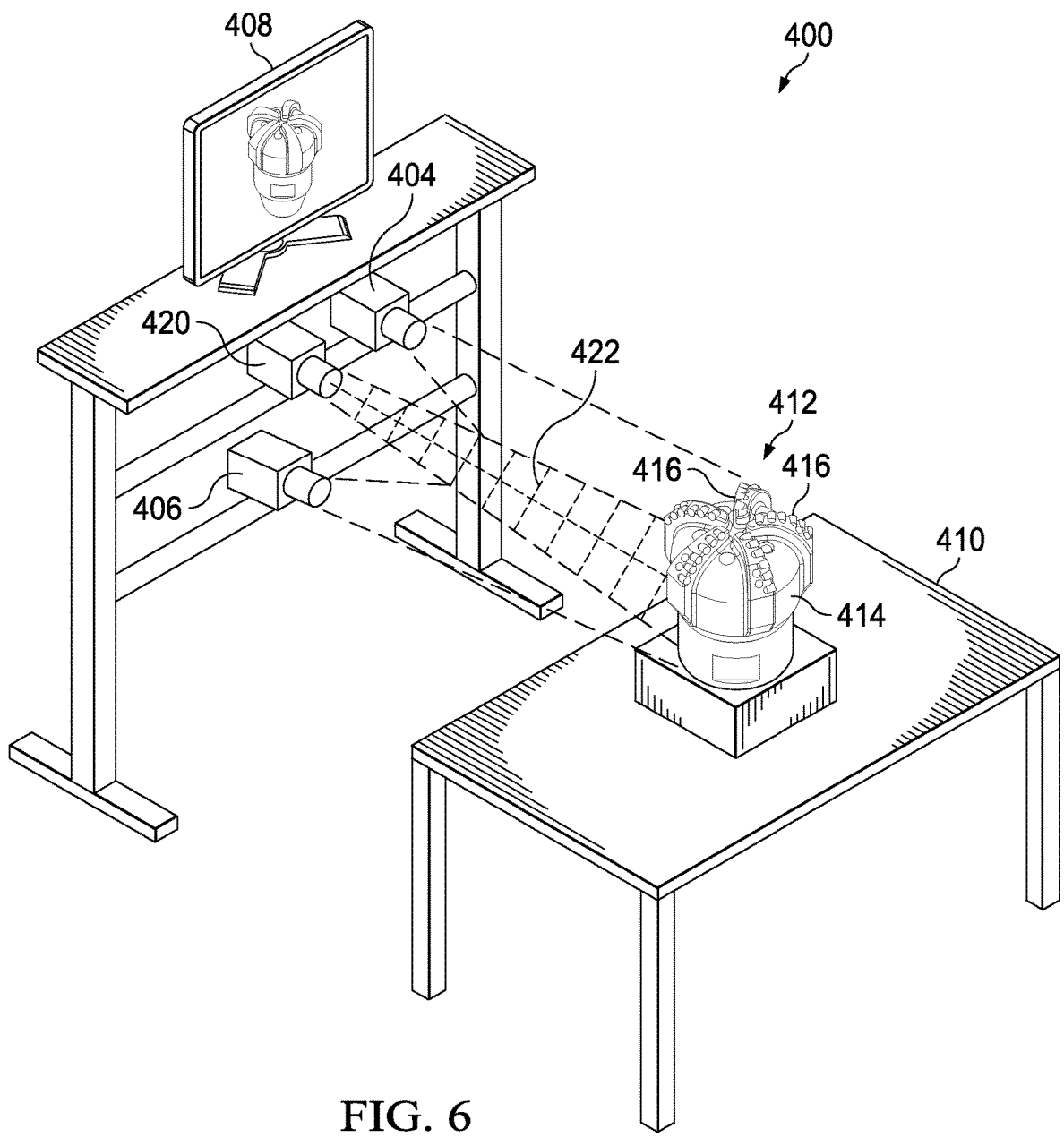
FIG. 6 is a live-tracking imaging and display system for implementing the process of FIG. 5.
Figure 7A:
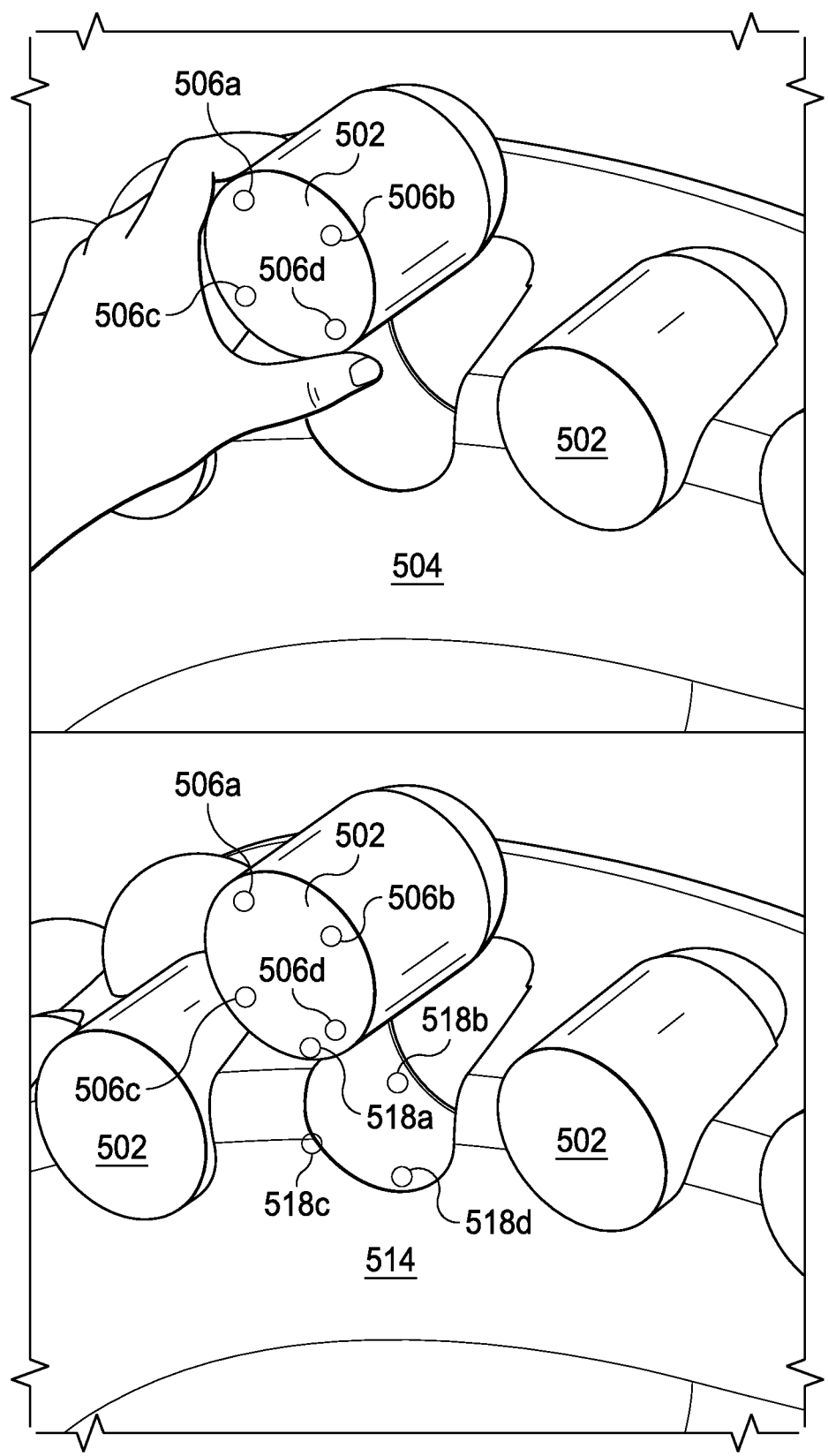
FIG. 7A is a screenshot showing an example of the live tracking mode for placing an object in its correct location that illustrates the placement of a cutting element relative to a drill bit body where a fabricator or user is in the process of affixing the cutting element to the drill bit body, the top portion of the screenshot showing a real-time image of the installation process and the bottom portion of the screenshot showing a real time image of a model cutting element being affixed to a model of a drill bit body.
Figure 7B:
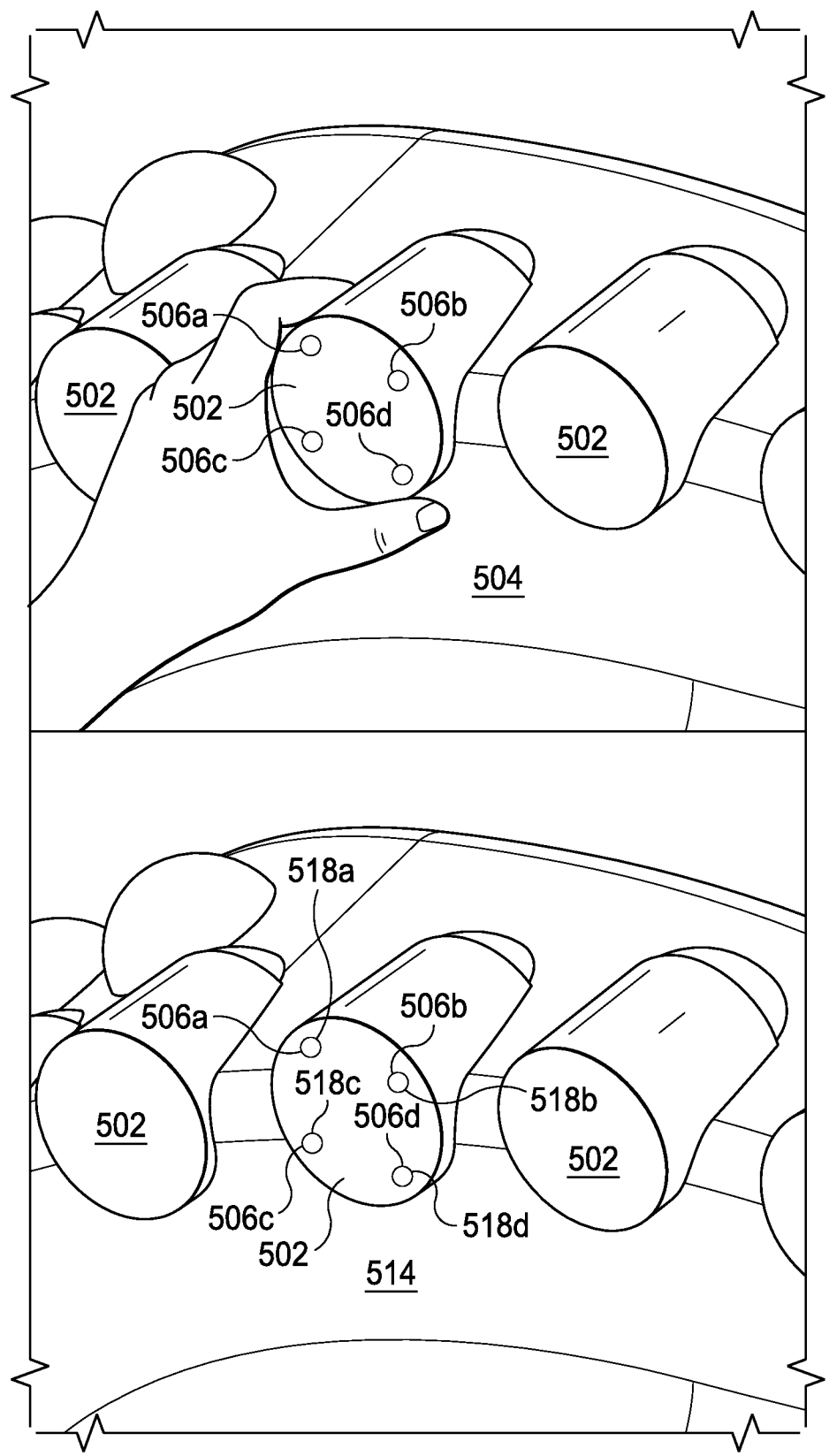
FIG. 7B is a screenshot showing an example of the live tracking mode for placing an object in its correct location that illustrates the placement of the cutting element relative to the drill bit body where a fabricator or user has correctly seated the cutting element relative to the drill bit body, the top portion of the screenshot showing a real-time image of the installation and the bottom portion of the screenshot showing a real-time image of the model cutting element being affixed to the model of the drill bit body.

The systems and methods described below facilitate the precise fabrication of drill bits and, more particularly, the placement of cutting elements on either a rotary cone or a fixed-cutter drill bit body, either of which may be referred to as a "cutting element support structure." As described in more detail below, the systems and methods may also have broader applicability in the field of oil field tool fabrication. For example, FIG. 5 describes an illustrative process for precisely affixing a cutting element to a support structure, such as a drill bit body or rotary cone and FIG. 6 shows a representative system for implementing such a process. FIGS. 7A and 7B show screen shots that may be displayed to a user of the process of FIG. 5 and system of FIG. 6.

As shown in FIG. 6, the representative system 400 includes a control system 402, which may include a processor, memory, power source, and input/output subsystem. The memory may be used to store instructions to cause the processor to execute the process of FIG. 5 or a similar process, to store and analyze images of cutting elements, rotary cones, drill bit bodies, drill bits, and other components thereof (collectively, "drill bit components"). As referenced herein, "images", or "live images" may refer to a live video feed. In addition, the memory may store computer-aided-design (CAD) models of master drill bit components or master drill bit assemblies that correspond to design specifications. The processor may implement instructions read from the memory, receive commands from the input/output subsystem, and generate output to the input/output subsystem.

To receive input and gather imaging data, the input-output subsystem of the control system may include an imaging system having one or more cameras, such as a first camera 404 and second camera 406. One or more additional cameras may also be included. In an embodiment, the cameras 404, 406 may be used to capture one or more three-dimensional images of, for example, a drill bit component or to render a live, real-time three-dimensional image of drill bit components using ambient light. In the embodiment of FIG. 6, the cameras 404 and 406 are operable to generate a three dimensional image of a drill bit 412, including a drill bit body 414 and a plurality of cutting elements 416. In an embodiment, the cameras 404, 406 form a portion of a three-dimensional imaging scanner that also includes a projector 420 that illuminates or projects an image of a grid 422 onto the drill bit 412 and drill bit body 414 to assist with imaging and the mapping of location data. The projector 420 may be an independent mechanism coupled to the imaging system or formed integrally with one of the cameras 404, 406. In an embodiment, the projected grid 422 is an ultraviolet light grid 422 that is projected onto the drill bit 412. The grid 412 displays a fringe pattern on the surface of the component 412 that is read by the cameras 404, 406. The data gathered by the cameras 404, 406 is converted into location data such as coordinate data that can be used to derive measurement point data and reference point data, as described in more detail below.

In FIG. 6, the drill bit 412 is shown mounted to a jig or fixture 410 that supports and stabilizes the drill bit body 414 during a fabrication or joining process in which the cutting elements 412 are affixed to the drill bit body 414. To provide feedback to a user, the system 400 also includes a display 408, and may also include an audible output device, such as a speaker. The display 408, speaker, and other output devices may be communicatively coupled to the input/output subsystem at the control system 400 to receive data from the control system 400 and convey the data to a user.

Figure 5:
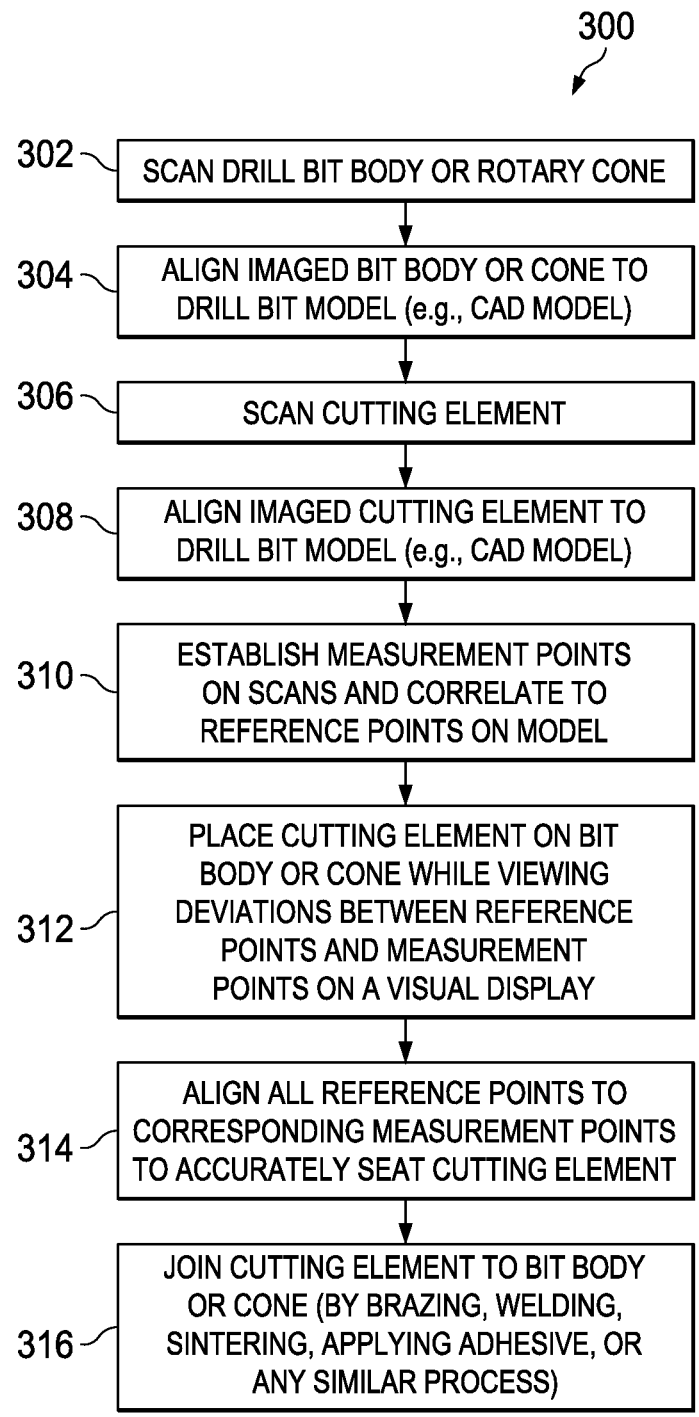
FIG. 5 is a flowchart showing an illustrative process for manufacturing a drill bit that includes aligning measurement points on a cutting element to corresponding reference points on a model drill bit.

To assist a user in fabricating a drill bit or other tool, the control system 400 may execute one or processes that are similar to the illustrative process shown in FIG. 5. Generally, the process includes scanning an item to be included within an assembly and the support structure to which the item is to be assembled. The scans are used to generate three-dimensional images of the item and support structure. The images may be analyzed to generate measurement points, which are correlated to references points on a model assembly that includes models of the item and support structure. By ensuring that the measurement points and reference points converge to have identical location data, or identical location data within design tolerances, the illustrative system and method can be used in a number of applications related to the fabrication of oil-field tooling. The embodiment discussed in more detail in this application relates to the assembly of a cutting element to a drill bit, or cutting element support structure. Yet the illustrative systems and processes may be similarly applicable to the assembly of, for example: (1) joining cutting elements to rock bit cones, (2) joining cones to a roller cone bit body, (3) joining a pin connector, such as an American Petroleum Institute (API) connection, to a drill bit body, (4) joining other female and male threaded parts to a bottom hole assembly (BHA), (5) joining a cutting element to a reamer body, (6) joining a reamer arm to a reamer body, (7) joining a cutting element to any other hole-expanding tool or coring tool, (8) joining a sensor, such as a measurement-while-drilling (MWD) or logging-while-drilling (LWD) sensor to a BHA or drill bit, (9) joining a signaling device to a BHA or drill bit, and (10) joining other types of electrical devices to a BHA or drill bit.

Referring again to the process of FIG. 5, which relates to the assembly of a drill bit cutting element to a drill bit body, the illustrative process includes scanning a cutting element support structure 302, which, as noted above, may be a rotary cone or a drill bit body, to generate a three-dimensional image of the bit body, which may also be referred to as a cutting element support structure. The three-dimensional image is analyzed and correlated to a model of the cutting element support structure 304 or related assembly and stored in memory. The process 300 also includes scanning a cutting element 306 or other component to be affixed to the cutting element support structure, such as a wear gauge, to generate a three-dimensional image of the cutting element or other component. The three-dimensional image of the cutting element is also analyzed and correlated to a model of the cutting element or other component 308 and stored in memory.

In an embodiment, the step of generating the three-dimensional images of the cutting element (or other component) and cutting element support structure and storing the images in memory includes analyzing the images to generate measurement points. As referenced herein, measurement points are points on element to be assembled and the support structure, which may be the actual scanned cutting element and drill bit body. The measurement points may be identified as location data, such as coordinates in a three-dimensional image or by using other location indicia, and may be generated in a number of ways. In an embodiment, the measurement points correspond to the locations of markers that are physically placed on the cutting element and drill bit body prior to imaging. In other embodiments, the measurement points may be selected by an algorithm that randomly selects measurement points from an image, by preselected measurement points that correspond to identifiable features of the imaged object (such as a part line inflection point on a surface), or by preselected measurement points that correspond to locations on the grid 422 that is projected onto the imaged object.

The measurement points are detected by the cameras if the measurement points correspond to markers, or identified from images gathered by the cameras when such markers are not used, and stored in a point cloud or other suitable data structure. The point cloud or other measurement point data may be stored as coordinate data that indicates the actual locations of the measurement points. To facilitate the use of the measurement point data in assembling the element to the support structure, the images are analyzed and the system identifies reference points that correspond to the measurement points, and correlates the measurement points to reference points. As referenced herein, each reference point is a point on the model that serves as a datum or locating feature for evaluation purposes. The reference point may also be expressed or tracked as a point of origin (in the case of a datum), or as a set of three-dimensional coordinates. In an embodiment, the reference point is a point on a surface or a point at a corner of a model of a drill bit component, such as a model cutting element, that can be compared to a corresponding measurement point on the actual drill bit component of the same type to determine how precisely the component was made (relative to the model) or to assist with the installation of the drill bit component by determining the difference between the location data of the reference point and the location of the measurement point.

From the forgoing, it may be apparent that each measurement point has location data that may function as a checkpoint for comparison with the location data of a corresponding reference point. Thus, the reference point location data may function as a checksum to check how accurately a component is fabricated, assembled, or otherwise installed by determining the difference between the location data of a measurement point and the location data of the of a corresponding reference point. For example, if a hypothetical drilling system component is a cube, each of the eight corners of the cube may be designated as measurement points on the actual component by analyzing a three dimensional image of the component, and each of the eight corners of the model of the cube may be designated as reference points in an image or rendering of the model.

In an embodiment, measurement point markers are placed on the actual element prior to imaging and the locations of the measurement point markers are identified using the cameras to construct an image based on a comparison of measurement points on the actual part in relation to the reference points. The locations of the reference points may be aligned to a three dimensional model of the completed drill bit so that the reference points correspond to the intended locations of the measurement points following assembly. Further, the measurement point locations may be compared to the reference point locations by operation of tracking software to assist a user to align the physical element to in its intended location on the support structure. In an embodiment, the system provides display data to a user, which may include real-time moving image data and continuously updated coordinate data that illustrate the real-time deviations between the locations of one or more of the measurement points and one or more of the locations, or "virtual locations" of the reference points. Such a system may be used to provide a live feed tracking method to validate and enhance to fabrication process. To verify how accurately the component is fabricated or installed in an assembly, such as a drill bit, the coordinates of any one or more of the measurement points (1, 2, 3, . . . , 8) may be compared to one or more of the corresponding reference points (1, 2, 3, . . . , 8) to enable an operator to determine how accurately the component is installed. If the measurement points are identical to the reference points, then a user can infer that the component was made or installed correctly. Conversely, if one or more measurement points differs significantly from its corresponding reference point, the user may infer that the component was either not made or not installed correctly.

In accordance with an illustrative embodiment, in operation, as the operator is bringing the element or component part to its correct position on the master part or assembly and viewing the screen for deviations, the measurement point markers on the actual part will align to the reference points in the virtual image because they will converge if the component part is properly joined to the assembly. Conversely, when the operator can see from the display that that the measurement point locations and reference point locations are not aligned, he will see corresponding surface deviations in the virtual image that indicate the distance that, for example, a surface of the part protrudes from the surface from the model part. As the operator moves the physical part to reduce the viewed deviation, the live feedback display will show the virtual part being moved to converge with the model (so that, for example, the front surface of the imaged element and the front surface element in the model assembly converge) and the displayed deviations will decrease in real-time. The operator may continuously alter the position of the part until the deviation in each direction is zero, at which point all the measurement points on the physical part will be aligned to the reference points shown in the image of the model, which may also be referred to as a virtual image or rendering.

While the system described above may indicate the variations between the model part locations and actual part locations as linear measurements between points, the display may also provide other measurements that correspond to the variance. For example, the variance may also be expressed as differences in volume or surface area.

Using the system of FIG. 6, for example, the measurement points and reference points may be compared to determine how accurately a component is aligned in a final assembly before it is permanently fixed in place. For example, in the case of a drill bit and cutting element, a user may align the cutting element on the drill bit body (or rotary cone), check to see whether the alignment is consistent with a model drill bit by comparing measurement points to reference points, and choose whether or not to complete the installation or improve the alignment of the cutting element based on the comparison.

Referring again to the process of FIG. 5, the process includes a similar step of placing a cutting element on the drill bit body or rotary cone and viewing a live comparison of actual images of the components as compared to an assembled model and by viewing real-time deviations between reference points and measurement points on a visual display 312. For example, as a user sets a cutting element on a drill bit body prior to initiating a brazing process to fix the cutting element in place, continuous, live images may be captured and analyzed to compare the locations of the reference points on the model drill bit to measurement points on the actual cutting element or drill bit body. Based on the comparison, the system operating the process may display to a user an image that shows an outline of the location of a model cutting element in a model drill bit alongside a real time position of the actual cutting element to provide real-time feedback to an operator of the system. Alternatively, the differences between the measurement points and the reference points may be displayed to the user as quantitative values, which may be actual vector displacements, volumetric deviations, or surface area deviations, to indicate to the user the extent to which the cutting element is misaligned with the model cutting element in the model drill bit.

While a user may be able to determine whether the cutting element is properly seated from viewing the display, other types of notification systems may also be incorporated. For example, an audible system may provide an audible signal to indicate that the cutting element is seated properly or, within tolerances based on part specifications and tolerances or another type of predetermined threshold. Alternatively, an audible system may provide an audible signal to indicate that the cutting element is not seated properly.

Based on the information provided to the user, the user may align all measurement points to corresponding reference points to accurately seat the cutting element 314. Once the cutting element is properly seated, the user joins the cutting element to the cutting element support structure by welding, brazing, or using another similar joining process 316 to complete the installation or fixation of the cutting element.

In an embodiment, the system described above may be used to fabricate a component that has a high degree of reflectivity, such as a steel drill bit body or cutting element. In such an embodiment, to prevent the reflectivity of the materials from interfering with the operation of the cameras, a non-reflective coating may be applied to reduce reflectivity and assist the cameras to capture the geometry of the components more accurately.

FIGS. 7A and 7B, show exemplary screenshots for a display being operated by a user in accordance with the systems and processes described above. In the example of FIGS. 7A and 7B, a cutting element 502 is being assembled to a drill bit body 504 that forms a cutting element support structure. The upper portion of the screenshot shows a live, real-time video feed generated by the cameras, and the lower portion shows corresponding continuous, live video feed of virtual images, which may be understood to be images of a modeled or rendered cutting element 512 relative to a modeled or rendered support structure 514. As shown, the system has assigned, detected, or otherwise established four measurement points 506a-d on the cutting element 502 and cutting element model 512, which are displayed in both portions of the screen. The system has also assigned four reference points 518a-d that correspond to the intended locations of the measurement points 506a-d in accordance with design specifications. The lower portion of the first screenshot shown in FIG. 7A indicates that the cutting element 502 is not yet properly seated, which the user may readily determine by viewing the images.

As noted above, the measurement points 506a-d may be actual markers placed on the cutting element 502 before it is scanned, and the location data of the measurement points 506a-d and reference points 518a-d may be stored in a point cloud or other data structure to be used with software for generating and analyzing the images. The virtual image shown in the lower portion of the image of FIG. 7A shows that the operator assembles the drill bit by aligning the locations of the measurement points 506a-d or markers to the corresponding reference point locations.

The cutting element 502 has been moved into the correct location for installation in the second screenshot of FIG. 7B, which is indicated by the visual coincidence, or co-location, of the measurement points 506a-d and reference points 518a-d. By looking at the lower portion of the second screenshot of FIG. 7B, which may also be understood to be the virtual image, the user may see that, for example, the measurement point 506a is co-located with reference point 518a, that the measurement point 506b is co-located with reference point 518b, that the measurement point 506c is co-located with reference point 518c, and so on. In addition, the system may play an audible sound to indicate that the measurement points 506a-e and reference points 518a-e are co-located and that the cutting element is properly seated so that the user may start a brazing or other joining process to affix the cutting element 502 to the supporting structure 504.

The foregoing describes a representative method of manufacturing a drill bit that includes aligning a cutting element support structure to an image of a model cutting element support structure and placing a cutting element on the cutting element support structure. More generally, the representative method may also be understood to be a method of manufacturing a tool that includes aligning a component and a support structure to an image of a model assembly and placing the element on the support structure such that images of the actual component and support structure converge with virtual images of a model assembly as the component is moved into place. The method also includes comparing the placement of the cutting element on the cutting element support structure to the placement of a model cutting element on the image of the model cutting element support structure in real-time by, for example, viewing continuous, live video feed of the model and/or actual cutting element support structure and the model and/or actual cutting element. The method further includes adjusting the placement of the cutting element on the cutting element support structure to match the placement of the model cutting element on the image of the model cutting element support structure, and joining the cutting element to the cutting element support structure.

The method may be implemented by scanning the cutting element support structure with measurement point markers, converting the marker locations to measurement points, and correlating the measurement points to reference points that are indicative of the correct locations of the markers relative to the cutting element support structure. This enables the video feed to show the actual marker locations as they are aligned to the reference point locations displayed on a monitor. In addition, the method may include imaging the cutting elements with measurement points and converting the measurement points to location data, which may be point cloud data that includes, for example, coordinate data. The location data may be compared to the location data of reference point location data that corresponds to the correct positions of the measurement points relative to the cutting element support structure so that the video feed can show the actual measurement points as they are aligned to the reference points on a display or computer monitor.

In an embodiment, the method may include (1) imaging or scanning the cutting element support structure and establishing measurement points on the cutting element support structure, (2) correlating the measurement points on the support structure to reference points on a model cutting element support structure, (3) imaging or scanning the cutting elements and establishing second measurement points on the cutting elements, and (4) correlating the second measurement points to second reference points on the model cutting element support structure. Imaging or scanning the cutting element and cutting element support structure and establishing measurement points on each item may be accomplished using any of the representative systems or methods described above. For example, the measurement points may be established by detecting markers placed on a cutting element or located by a user or algorithm upon analysis of the cutting element. The second reference points may correspond to the intended location of the second measurement points if the cutting element is installed in accordance with the design specifications. In such an embodiment, a step of placing the cutting element on the cutting element support structure to seat the cutting element comprises viewing a continuous, live video feed that shows deviations between the second measurement points and second reference points.

In an embodiment, a method for controlling the manufacture of a drill bit includes one or more of the following steps: (1) computing a variance between measurement points on a cutting element support structure to reference points on a model cutting element support structure, (2) computing a second variance between second measurement points on a cutting element and second reference points on a model assembly, such as a model drill bit, and (3) displaying a video image of the cutting element relative to the model assembly. Here, displaying a video image of the cutting element relative to the model cutting element support structure may include displaying a vector or the magnitude of a vector, such vector indicating the distance from the second reference points to the second measurement points or deviations from the physical part surfaces to the model part surfaces. The vector may be expressed as a displacement along three perpendicular axes (x, y, and z), as a measurement of overlapping or non-overlapping volume, or as a measurement of overlapping or non-overlapping surface area.

The foregoing method may also include calculating one or more vector measurements corresponding to the distance from the second measurement points to the second reference points, and may also include comparing the calculated vector measurements to a predetermined threshold and generating an alarm in response to determining that the calculated vector measurement has a lesser or greater magnitude than the predetermined threshold. Similar methods may be applied where volume or surface area measurements are used in place of vector measurements. The alarm may be an audio signal, such as a bell, chime, or buzzing sound, or a visual signal, such as a flashing light or a red light.

In an embodiment, a system for manufacturing a drill bit includes a control system having a processor, a memory, a power source, and an input-output subsystem. The system includes one or more cameras or imaging sensors and projector coupled to the input-output subsystem and operable to scan an image of a cutting element support structure and an image of a cutting element. In addition, the system includes one or more displays coupled to the input-output subsystem. The control system is operable to receive the scanned image of the cutting element support structure and generate a plurality of measurement points, each such measurement point corresponding to a location of a marker or another selected location on the cutting element support structure. Each measurement point is correlated to a reference point of a model assembly or cutting element support structure.

The system is also operable to receive the scanned image of the cutting element and generate a plurality of second measurement points corresponding to a location of a marker or another selected location on the cutting element. Each such second measurement point is correlated to a second reference point on the model cutting element support structure or drill bit assembly. The control system is further operable to generate a live video image to the display showing the position of each of the measurement points and second measurement points relative to the reference points and second reference points. The control system may be operable to compute the distances between each measurement point and second measurement point and each reference and second reference point, respectively. The processor may also be operable to communicate a live video image to the display to show the computed distance between at least one of the measurement points and second measurement points and at least one of the corresponding reference points and second reference points. It is noted that once the support structure or drill bit body, is appropriately aligned with the model such that the measurement points are aligned with the reference points, the system may deactivate the display of data relating to the comparison of measurement points to reference points and display only data relating to the comparison of second measurement points and second reference points to simplify the presentation of data being provided to a user.

In accordance with the foregoing system, the processor may be operable to compare the computed distances between each second measurement point and each second reference point to a predetermined threshold, and to generate a signal indicating that at least one of the computed distances is greater than the predetermined threshold. The system may include a speaker to generate an audible alarm or a display or light to generate a visual signal in response to receiving a signal from the control system indicating that at least one of the computed distances is greater than the predetermined threshold.

The illustrative systems, methods, and devices described herein may also be described by the following examples:

Example 1

A method of manufacturing a drill bit, the method comprising:
using an imaging system to align a scanned image of a cutting element support structure to an image of a model of the cutting element support structure in a computer-generated model of a drill bit assembly;
placing a cutting element on the cutting element support structure;
using the imaging system to compare the placement of the cutting element on the cutting element support structure to the placement of a computer-generated model of the cutting element on the image of the model of the drill bit assembly based on real-time, continuous visual feedback;
adjusting the placement of the cutting element on the cutting element support structure to match the placement of the model of the cutting element on the image of the model of the drill bit assembly; and
joining the cutting element to the cutting element support structure.

Example 2

The method of example 1, the method further comprising:
scanning the cutting element support structure to generate an image of the cutting element support structure;
establishing measurement points on the cutting element support structure based on the image of the cutting element support structure;
correlating the measurement points to reference points on the model of the drill bit assembly; and
comparing the measurement points to the reference points.

Example 3

The method of examples 1 and 2, the method further comprising:
scanning the cutting element to generate an image of the cutting element;
establishing second measurement points on the cutting element based on the image of the cutting element;
correlating the second measurement points to second reference points on the model of the drill bit assembly; and
comparing the second measurement points to the second reference points.

Example 4

The method of example 3, wherein comparing second measurement points to the second reference points comprises generating a linear measurement that indicates the difference between the location of the second measurement point and second reference point.

Example 5

The method of example 3, wherein comparing second measurement points to the second reference points comprises generating a volumetric measurement that indicates the difference between the location of the second measurement point and second reference point.

Example 6

The method of example 3, wherein comparing second measurement points to the second reference points comprises generating a surface area measurement that indicates the difference between the location of the second measurement point and second reference point.

Example 7

The method of examples 1-6, the method further comprising:
  scanning the cutting element support structure and detecting measurement points on the cutting element support structure, such measurement points corresponding to reference points on the model of the drill bit assembly; and
  scanning the cutting elements and detecting second measurement points on the cutting elements, such second measurement points corresponding to second reference points on the model of the drill bit assembly;
  wherein placing the cutting element on the cutting element support structure comprises viewing a continuous, live video feed showing deviations between the second measurement points and second reference points.

Example 8

The method of example 7, wherein adjusting the placement of the cutting element on the cutting element support structure to match the placement of the model of the cutting element on the image of the model of the drill bit assembly comprises aligning the second measurement points and second reference points.

Example 9

The method of examples 7 and 8, wherein joining the cutting element to the cutting element support structure comprises brazing the cutting element to the cutting element support structure.

Example 10

The method of examples 7-9, wherein the model of the drill bit assembly comprises a computer-assisted-design model of a template drill bit.

Example 11

A method for controlling the manufacture of an oil-field tool, the method comprising:
  computing a variance between measurement points on a support structure to reference points on a computer-generated model of the oil-field tool;
  computing a second variance between measurement points on an oil-field tool element to second reference points on the model of the oil-field tool; and
  displaying a video image of the oil-field tool element relative to the model of the oil-field tool in real time.

Example 12

The method of example 11, wherein displaying a video image of the oil-field tool element relative to the model of the oil-field tool comprises displaying a volumetric measurement indicating the distance from the second measurement points to the second reference points.

Example 13

The method of examples 11-12, wherein displaying a video image of the oil-field tool element relative to the model of the oil-field tool comprises displaying a surface area measurement indicating the distance from the second measurement points to the second reference points.

Example 14

The method of examples 11-13, wherein displaying a video image of the oil-field tool element relative to the model of the oil-field tool comprises displaying a vector, such vector indicating the distance from the second measurement points to the second reference points.

Example 15

The method of example 14, wherein displaying a video image of the oil-field tool element relative to the model of the oil-field tool comprises displaying a displacement along three perpendicular axes.

Example 16

The method of examples 11-15, further comprising calculating a plurality of vector measurement corresponding to the distance from the second reference points to the second measurement points.

Example 17

The method of example 16, further comprising comparing the calculated vector measurements to a predetermined threshold and generating an alarm in response to determining that the calculated vector measurement is greater than the predetermined threshold.

Example 18

The method of example 17, wherein the alarm comprises an audible signal.

Example 19

The method of example 17, wherein the alarm comprises a visual signal.

Example 20

The method of examples 11-19, further comprising
  adjusting the placement of the oil-field tool element on the support structure to match the placement of a model of the oil-field tool element on the image of the model of the tool; and
  joining the oil-field tool element to the support structure.

Example 21

The method of examples 11-20, wherein the oil-field tool element comprises a cutting element and the oil-field tool comprises a rock bit cone.

Example 22

The method of examples 11-20, wherein the oil-field tool element comprises a cone element and the oil-field tool comprises a roller cone bit.

Example 23

The method of examples 11-20, wherein the oil-field tool element comprises a pin connector and the oil-field tool comprises a drill bit.

Example 24

The method of examples 11-20, wherein the oil-field tool element comprises a threaded part and the oil-field tool comprises a bottom hole assembly.

Example 25

The method of examples 11-20, wherein the oil-field tool element comprises a cutting element and the oil-field tool comprises a reamer.

Example 26

The method of examples 11-20, wherein the oil-field tool element comprises a reamer arm and the oil-field tool comprises a reamer.

Example 27

The method of examples 11-20, wherein the oil-field tool element comprises a sensor and the oil-field tool comprises a bottom hole assembly.

Example 28

The method of examples 11-20, wherein the oil-field tool element comprises a sensor and the oil-field tool comprises a drill bit.

Example 29

The method of examples 11-20, wherein the oil-field tool element comprises a signaling device and the oil-field tool comprises a bottom hole assembly.

Example 30

The method of examples 11-20, wherein the oil-field tool element comprises a signaling device and the oil-field tool comprises a drill bit.

Example 31

A system for manufacturing a drill bit, the system comprising:
a control system, the control system having a processor, a memory, a power source, and an input-output subsystem, the input-output subsystem comprising at least one camera and at least one projector operable to illuminate and scan an image of a cutting element support structure and an image of a cutting element, and at least one display operable to display a continuous live-tracking feed with visual feedback;
wherein the control system is operable to receive the scanned image of the cutting element support structure and to determine a plurality of measurement points, each such measurement point corresponding to a location on the cutting element support structure and to a reference point of a model of the drill bit, and to receive the scanned image of the cutting element and generate a plurality of second measurement points, each such second measurement point corresponding to a location on the cutting element and a second reference point on the model of the drill bit; and
the control system is further operable to generate a live, continuous video image to the display showing the position of each second measurement point relative to each second reference point.

Example 32

The system of example 31, wherein the control system is further operable to compute the distances between each second measurement point and each second reference point.

Example 33

The system of example 32, wherein the processor is operable to communicate a live, continuous video image to the display showing the computed distance between at least one of the second measurement points and at least one of the corresponding second reference points.

Example 34

The system of example 32, wherein the processor is operable to compare the computed distances between each second measurement point and each second reference point to a predetermined threshold, and to generate a signal indicating that at least one of computed distances is greater than the predetermined threshold.

Example 35

The system of example 34, further comprising a speaker operable to generate an audible alarm in response to receiving a signal from the control system indicating that at least one of the computed distances is greater than the predetermined threshold.

Example 36

The system of example 34, wherein the display is operable to generate a visual indicator in response to receiving a signal from the control system indicating that at least one of the computed distances is greater than the predetermined threshold.

It should be apparent from the foregoing that an invention having significant advantages has been provided. While the invention is shown in only a few of its forms, it is not limited to only these embodiments but is susceptible to various changes and modifications without departing from the spirit thereof.

I claim:

1. A method of manufacturing a drill bit assembly, the method comprising:
positioning a cutting element on a cutting element support structure of the drill bit assembly;
using an imaging system to acquire and compare a relative position of the cutting element on the cutting element support structure to a relative position of a computer-generated model of the cutting element on a computer-generated model of the cutting element support structure using a continuous, live video feed;

in response to the continuous, live video feed, adjusting a position of the cutting element on the cutting element support structure to an adjusted position that matches the relative position of the computer-generated model of the cutting element on the computer-generated model of the cutting element support structure; and joining the cutting element to the cutting element support structure at the adjusted position.

2. The method of claim 1, the method further comprising:
scanning the cutting element support structure to generate an image of the cutting element support structure;
establishing measurement points on the cutting element support structure based on the image of the cutting element support structure;
correlating the measurement points to reference points on the computer-generated model of the cutting element support structure; and
comparing the measurement points to the reference points.

3. The method of claim 1, the method further comprising:
scanning the cutting element to generate an image of the cutting element;
establishing second measurement points on the cutting element based on the image of the cutting element;
correlating the second measurement points to second reference points on the computer-generated model of the cutting element support structure; and
comparing the second measurement points to the second reference points.

4. The method of claim 3, wherein comparing the second measurement points to the second reference points comprises generating a linear measurement that indicates a difference between a location of a second measurement point and a second reference point.

5. The method of claim 3, wherein comparing the second measurement points to the second reference points comprises generating a volumetric measurement that indicates a difference between a location of a second measurement point and a second reference point.

6. The method of claim 3, wherein comparing the second measurement points to the second reference points comprises generating a surface area measurement that indicates a difference between a location of a second measurement point and a second reference point.

7. The method of claim 1, the method further comprising:
scanning the cutting element support structure and detecting measurement points on the cutting element support structure, the measurement points corresponding to reference points on the computer-generated model of the cutting element support structure; and
scanning the cutting element and detecting second measurement points on the cutting elements, the second measurement points corresponding to second reference points on the computer-generated model of the cutting element support structure;
wherein positioning the cutting element on the cutting element support structure comprises viewing the continuous, live video feed showing deviations between the second measurement points and second reference points.

8. A method of manufacturing an oil-field tool, the method comprising:
positioning an oil-field tool element on a support structure of the oil-field tool;
using an imaging system to acquire and compare a relative position of the oil-field tool element on the support structure to a relative position of a computer-generated model of the oil-field tool element on a computer-generated model of the support structure using a continuous, live video feed of the oil-field tool element relative to the computer-generated model of the oil-field tool;
in response to the continuous, live video feed, adjusting a position of the oil-field tool element on the support structure to an adjusted position that matches the relative position of the computer-generated model of the oil-field tool element on the computer-generated model of the support structure; and
joining the oil-field tool element to the support structure at the adjusted position.

9. The method of claim 8, wherein the continuous, live video feed comprises a volumetric measurement indicating a difference between the relative position of the oil-field tool element on the support structure and the relative position of the computer-generated model of the oil-field tool element on the computer-generated model of the support structure.

10. The method of claim 8, wherein the continuous, live video feed comprises a surface area measurement indicating a difference between the relative position of the oil-field tool element on the support structure and the relative position of the computer-generated model of the oil-field tool element on the computer-generated model of the support structure.

11. The method of claim 8, wherein the continuous, live video feed comprises a vector measurement indicating a distance between a measurement point of the oil-field tool element and a reference point of the computer-generated model of the support structure.

12. The method of claim 11, wherein the live video feed comprises a plurality of vector measurements corresponding to distances between a plurality of measurement points of the oil-field tool element and a plurality of reference points of the computer-generated model of the support structure.

13. The method of claim 12, further comprising comparing at least one of the vector measurements to a predetermined threshold and generating an alarm in response to determining that the calculated vector measurement is greater than the predetermined threshold.

14. The method of claim 13, wherein the alarm comprises a visual signal.

15. A system for manufacturing a drill bit, the system comprising:
a control system having a processor, a memory, a power source, and an input-output subsystem, the input-output subsystem comprising at least one camera and at least one projector operable to illuminate and scan an image of a cutting element support structure and an image of a cutting element, and at least one display operable to display a continuous, live video feed that is indicative of a position of the cutting element on the cutting element support structure in real time;
wherein the control system is operable to receive the scanned image of the cutting element and generate a plurality of measurement points, each of the plurality of measurement points corresponding to a location on the cutting element and a reference point on a computer-generated model of the cutting element support structure; and the control system is further operable to generate the continuous, live video feed signal to the display showing the position of each measurement point relative to each reference point.

16. The system of claim 15, wherein the control system is further operable to compute distances between each measurement point and each reference point.

17. The system of claim 16, wherein the processor is operable to communicate the continuous, live video feed to the display, the continuous, live video feed including the computed distance between at least one of the measurement points and at least one of the corresponding reference points.

18. The system of claim 16, wherein the processor is operable to compare the computed distances between each measurement point and each reference point to a predetermined threshold, and to generate a signal indicating that at least one of computed distances is greater than the predetermined threshold.

19. The system of claim 18, further comprising a speaker operable to generate an audible alarm in response to receiving a signal from the control system indicating that at least one of the computed distances is greater than the predetermined threshold.

20. The system of claim 18, wherein the display is operable to generate a visual indicator in response to receiving a signal from the control system indicating that at least one of the computed distances is greater than the predetermined threshold.

* * * * *